(12) United States Patent
Kasapi (10) Patent No.: US 7,990,167 B2
(45) Date of Patent: Aug. 2, 2011

(54) SYSTEM AND METHOD FOR MODULATION MAPPING (75) Inventor: Steven Kasapi, San Francisco, CA (US)

(73) Assignee: DCG Systems, Inc., Fremont, CA (US)

( * ) Notice: Subject to any disclaimer, the term of this patent is extended or adjusted under 35 U.S.C. 154(b) by 0 days.

(21) Appl. No.: 12/534,069

(22) Filed: Jul. 31, 2009

(65) Prior Publication Data
US 2010/0039131 A1 Feb. 18, 2010

Related U.S. Application Data (62) Division of application No. 11/438,121, filed on May 18, 2006, now Pat. No. 7,733,100.

(60) Provisional application No. 60/711,822, filed on Aug. 26, 2005.

(51) Int. Cl.
G01R 31/305 (2006.01)
(52) U.S. Cl. .............................. 324/754.23; 324/754.21
(58) Field of Classification Search ............... 324/158.1, 324/750–753, 765; 250/338.4, 340, 341.2, 250/341.4, 341.8, 370.01, 492.2
See application file for complete search history.

(56) References Cited

U.S. PATENT DOCUMENTS

| 3,524,694 | A | 8/1970 | Klein et al. |
| 3,711,186 | A | 1/1973 | O'Connor |
| 3,912,378 | A | 10/1975 | Goto |
| 4,297,032 | A | 10/1981 | Temple |
| T102,104 | I4 | 8/1982 | Kirk et al. |
| 4,353,618 | A | 10/1982 | Hagner et al. |
| 4,555,767 | A | 11/1985 | Case et al. |
| 4,588,950 | A | 5/1986 | Henley |
| 4,615,620 | A | 10/1986 | Noguchi et al. |
| 4,625,114 | A | 11/1986 | Bosacchi et al. |
| 4,634,234 | A | 1/1987 | Baumann |
| 4,680,635 | A | 7/1987 | Khurana |
| 4,681,449 | A | 7/1987 | Bloom et al. |
| 4,698,587 | A | 10/1987 | Burns et al. |
| 4,721,910 | A | 1/1988 | Bokor et al. |
| 4,724,322 | A | 2/1988 | Knowles et al. |
| 4,736,159 | A | 4/1988 | Shiragasawa et al. |
| 4,758,092 | A | 7/1988 | Heinrich et al. |
| 4,758,786 | A | 7/1988 | Hafeman |

(Continued)

OTHER PUBLICATIONS

Ulrike Kindereit, et al, "Comparison of Laser Voltage Probing and Mapping Results in Oversized and Minimum Size Devices of 120 nm and 65 nm Technology," Microelectronics Reliability, Aug.-Sep. 2008, pp. 1322-1326, vol. 48, Issues 8-9, 19th European Symposium on Reliability of Electron Devices, Failure Physics and Analysis (ESREF 2008).

(Continued)

Primary Examiner — Ha Tran T Nguyen
Assistant Examiner — Joshua Benitez
(74) Attorney, Agent, or Firm — Nixon Peabody LLP; Joseph Bach, Esq.

(57) ABSTRACT

An apparatus for providing modulation mapping is disclosed. The apparatus includes a laser source, a motion mechanism providing relative motion between the laser beam and the DUT, signal collection mechanism, which include a photodetector and appropriate electronics for collecting modulated laser light reflected from the DUT, and a display mechanism for displaying a spatial modulation map which consists of the collected modulated laser light over a selected time period and a selected area of the IC.

20 Claims, 10 Drawing Sheets
(2 of 10 Drawing Sheet(s) Filed in Color)

U.S. PATENT DOCUMENTS

| | | | |
|---|---|---|---|
| 4,811,090 | A | 3/1989 | Khurana |
| 4,908,568 | A | 3/1990 | Gerald |
| 4,956,603 | A | 9/1990 | Russo |
| 4,968,932 | A | 11/1990 | Baba et al. |
| 5,004,307 | A | 4/1991 | Kino et al. |
| 5,010,945 | A | 4/1991 | Burke |
| 5,087,121 | A | 2/1992 | Kakuchi et al. |
| 5,208,648 | A | 5/1993 | Batchelder et al. |
| 5,220,403 | A | 6/1993 | Batchelder et al. |
| 5,247,392 | A | 9/1993 | Plies |
| 5,282,088 | A | 1/1994 | Davidson |
| 5,334,540 | A | 8/1994 | Ishii |
| 5,412,328 | A | 5/1995 | Male et al. |
| 5,430,292 | A | 7/1995 | Honjo et al. |
| 5,430,305 | A | 7/1995 | Cole, Jr. et al. |
| 5,453,994 | A | 9/1995 | Kawamoto et al. |
| 5,457,536 | A | 10/1995 | Kornfield et al. |
| 5,475,316 | A | 12/1995 | Hurley et al. |
| 5,493,236 | A | 2/1996 | Ishii et al. |
| 5,532,607 | A | 7/1996 | Inuzuka et al. |
| 5,532,873 | A | 7/1996 | Dixon |
| 5,757,193 | A | 5/1998 | Yu et al. |
| 5,767,688 | A | 6/1998 | Takahashi et al. |
| 5,854,804 | A | 12/1998 | Winer et al. |
| 5,872,360 | A | 2/1999 | Paniccia et al. |
| 5,930,588 | A | 7/1999 | Paniccia |
| 5,940,545 | A | 8/1999 | Kash et al. |
| 6,057,677 | A | 5/2000 | Wakana et al. |
| 6,072,179 | A | 6/2000 | Paniccia et al. |
| 6,168,311 | B1 | 1/2001 | Xiao et al. |
| 6,251,706 | B1 | 6/2001 | Paniccia |
| 6,252,412 | B1 | 6/2001 | Talbot et al. |
| 6,462,814 | B1 | 10/2002 | Lo |
| 6,509,750 | B1 | 1/2003 | Talbot et al. |
| 6,591,121 | B1 | 7/2003 | Madarasz et al. |
| 6,594,086 | B1 | 7/2003 | Pakdaman et al. |
| 6,605,951 | B1 | 8/2003 | Cowan |
| 6,621,275 | B2 | 9/2003 | Cotton et al. |
| 6,633,366 | B2 * | 10/2003 | de Jager et al. ................. 355/67 |
| 6,720,588 | B2 | 4/2004 | Vickers |
| 6,727,501 | B1 | 4/2004 | Fan et al. |
| 6,739,511 | B2 | 5/2004 | Tsikos et al. |
| 6,778,327 | B2 | 8/2004 | Pakdaman et al. |
| 6,788,396 | B2 | 9/2004 | Stolte et al. |
| 6,797,581 | B2 | 9/2004 | Vickers |
| 6,798,562 | B2 | 9/2004 | Hakimi et al. |
| 6,812,464 | B1 | 11/2004 | Sobolewski et al. |
| 6,836,131 | B2 | 12/2004 | Cader et al. |
| 6,897,664 | B1 | 5/2005 | Bruce et al. |
| 6,971,791 | B2 | 12/2005 | Borden et al. |
| 7,605,597 | B2 * | 10/2009 | Aghababazadeh et al. ... 324/763 |
| 7,872,485 | B2 * | 1/2011 | Colvin .................... 324/754.23 |
| 2006/0066325 | A1 | 3/2006 | McGinnis et al. |
| 2006/0076503 | A1 | 4/2006 | Tsao |
| 2006/0273263 | A1 | 12/2006 | Raymond et al. |

OTHER PUBLICATIONS

Ulrike Kindereit, et al., "Investigation of Laser Voltage Probing Signals in CMOS Transistors," Reliability Physics Symposium, 2007, Proceedings 45th Annual IEEE International.

Ulrike Kindereit, et al, "Quantitative Investigation of Laser Beam Modulation in Electrically Active Devices as Used in Laser Voltage Probing," IEEE Transactions on Device and Materials Reliability, Mar. 2007, pp. 19-30, vol. 7, Issue 1.

\* cited by examiner

SYSTEM AND METHOD FOR MODULATION MAPPING

CROSS-REFERENCE TO RELATED APPLICATION

This application is a divisional application of U.S. patent application Ser. No. 11/438,121, filed on May 18, 2006, which claims the benefit of priority from, U.S. Provisional Patent Application Ser. No. 60/711,822, filed on Aug. 26, 2005, the entire disclosures of which are relied upon and incorporated herein by reference.

BACKGROUND

1. Field of the Invention

The present invention relates to an apparatus and method for probing integrated circuits using external illumination.

2. Description of the Related Art

Probing systems have been used in the art for testing and debugging integrated circuit (IC) designs and layouts. Various laser-based systems for probing IC's are known in the prior art. In these prior art systems, the DUT is driven by an electrical test signal, while a laser beam is used to illuminate the DUT. The laser beam then reflects from the DUT, and the reflection is perturbed according to the DUT's response to the electrical test signals. The reflected beam is then converted to an electrical signal having a waveform corresponding to the reflected beam. This waveform is displayed for the user's analysis.

While some description of the prior art is provided herein, the reader is encouraged to also review U.S. Pat. Nos. 5,208,648, 5,220,403 and 5,940,545, which are incorporated herein by reference in their entirety. Additional related information can be found in Yee, W. M., et al. *Laser Voltage Probe (LVP): A Novel Optical Probing Technology for Flip-Chip Packaged Microprocessors*, in International Symposium for Testing and Failure Analysis (ISTFA), 2000, p 3-8; Bruce, M. et al. *Waveform Acquisition from the Backside of Silicon Using Electro-Optic Probing*, in International Symposium for Testing and Failure Analysis (ISTFA), 1999, p 19-25; Kolachina, S. et al. *Optical Waveform Probing—Strategies for Non-Flip-chip Devices and Other Applications*, in International Symposium for Testing and Failure Analysis (ISTFA), 2001, p 51-57; Soref, R. A. and B. R. Bennett, *Electrooptical Effects in Silicon*. IEEE Journal of Quantum Electronics, 1987. QE-23(1): p. 123-9; Kasapi, S., et al., *Laser Beam Backside Probing of CMOS Integrated Circuits*. Microelectronics Reliability, 1999. 39: p. 957; Wilsher, K., et al. *Integrated Circuit Waveform Probing Using Optical Phase Shift Detection*, in International Symposium for Testing and Failure Analysis (ISTFA), 2000, p 479-85; Heinrich, H. K., *Picosecond Noninvasive Optical Detection of Internal Electrical Signals in Flip-Chip-Mounted Silicon Integrated Circuits*. IBM Journal of Research and Development, 1990. 34(2/3): p. 162-72; Heinrich, H. K., D. M. Bloom, and B. R. Hemenway, *Noninvasive sheet charge density probe for integrated silicon devices*. Applied Physics Letters, 1986. 48(16): p. 1066-1068; Heinrich, H. K., D. M. Bloom, and B. R. Hemenway, *Erratum to Noninvasive sheet charge density probe for integrated silicon devices*. Applied Physics Letters, 1986. 48(26): p. 1811; Heinrich, H. K., et al., *Measurement of real-time digital signals in a silicon bipolar junction transistor using a noninvasive optical probe*. IEEE Electron Device Letters, 1986. 22(12): p. 650-652; Hemenway, B. R., et al., *Optical detection of charge modulation in silicon integrated circuits using a multimode laser-diode probe*. IEEE Electron Device Letters, 1987. 8(8): p. 344-346; A. Black, C. Courville, G Schultheis, H. Heinrich, *Optical Sampling of GHz Charge Density Modulation in SIlicon Bipolar Junction Transistors* Electronics Letters, 1987, Vol. 23, No. 15, p. 783-784, which are incorporated herein by reference in their entirety.

Some of the test and debug technique used in the prior art include LIVA (Light Induced Voltage Alteration), TIVA (Thermally Induced Voltage Alteration), CIVA (Charge Induced Voltage Alteration), XIVA (Externally Induced Voltage Alteration), OBIC (Optical Beam Induced Current), OBHIC (Optical Beam Heat Induced Current), and OBIRCH (Optical Beam Induced Resistance Change). These techniques probe the DUT (device under test) to detect a change in the characteristics of certain devices or structures therein to thereby detect a failure or an area that is prone to fail or adversely affect the DUT's performance. According to these techniques, the DUT is driven by an electrical signal, while a laser beam is used to illuminate the DUT to thereby cause either heating, carrier generation, or both. As a result, the electrical output from the DUT is perturbed, and this perturbation is detected and analyzed. That is, under these techniques the laser beam is used only as a perturbing agent, but the detection is done by analyzing the electrical output from the DUT.

Figure 1:
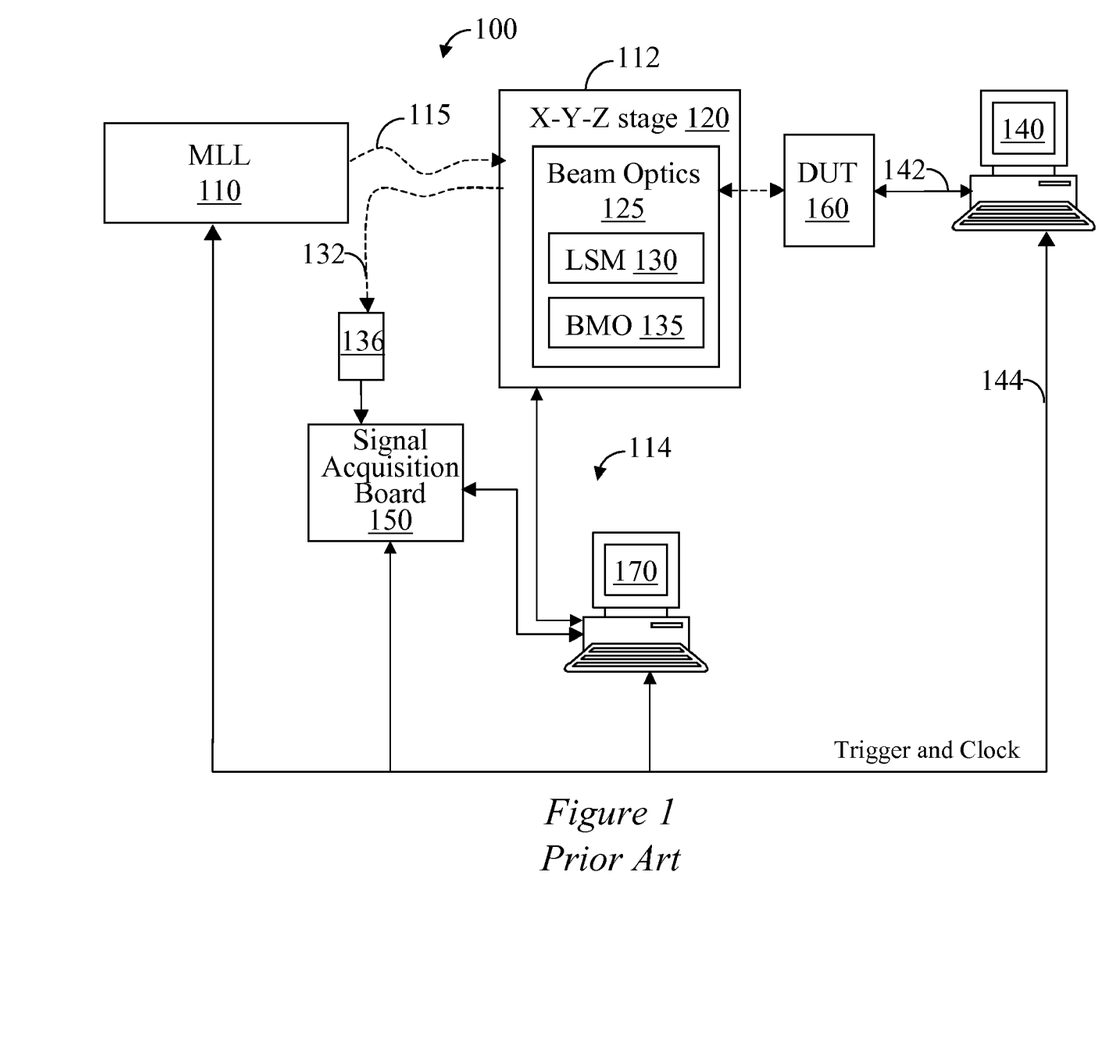
FIG. 1 is a general schematic depicting major components of a laser-based IC probe system architecture according to the prior art.

FIG. 1 is a general schematic depicting major components of a laser-based system architecture, 100, according to the prior art. In FIG. 1, dashed arrows represent optical path, while solid arrows represent electronic signal path. The optical paths represented by dashed lines are generally made using fiber optic cables. Probing system 100 comprises a mode-locked laser source MLL 110, an optical bench 112, and data acquisition and analysis apparatus 114. The optical bench 112 includes provisions for mounting the DUT 160 and includes beam optics 125. The beam optics may include various elements to shape the beam, generally shown as beam manipulation optics, BMO 135, and elements for pointing and/or scanning the beam over the DUT, such as a laser scanning microscope, LSM 130. A computer 140 or other device may be used to provide power and/or signals, 142, to the DUT 160, and may provides trigger and clock signals, 144, to the mode-locked laser source 110 and/or the analysis apparatus 114. The analysis apparatus, 114, includes workstation 170, which controls as well as receives, processes, and displays data from the signal acquisition board 150 and the optical bench 112.

In operation, computer 140, which may be a conventional ATE (Automated Testing Equipment, also known as Automated Testing and Evaluation), generates test vectors that are electrically fed to the DUT. The ATE also sends sync signal to the mode-locked laser source, which emits a laser beam. The beam optics 125 is then used to point the beam to illuminates various positions on the DUT. The beam reflects from the DUT, but the reflection is perturbed by the DUT's response to the test vectors. This perturbed reflection is detected by photodetector 136, which converts it into an analog signal. The analog signal is acquired by the signal acquisition board 150 and is fed to computer 170, where it is displayed as a waveform corresponding to the perturbed reflection from the DUT. By correlating the timeline of the waveform to that of the ATE, the response of the DUT can be analyzed.

While the arrangement depicted in FIG. 1 has been used successfully in the art, there is a constant search for new systems that can provide further information regarding the operation and characteristics of the DUT. Accordingly, there is a need in the art for a system that will allow improved laser probing of a DUT to enable further investigation of chip designs.

SUMMARY

Various embodiments of the present invention provide apparatus and method for laser probing of a DUT to provide modulation information of a selected location or of an area or the entire DUT.

According to various embodiments of the subject invention, probing of a DUT is done by applying stimulation signals to the DUT, and illuminating the DUT with a laser beam. The reflection of the laser beam is collected and analyzed to provide one or more of the reflection's amplitude, intensity and phase for a selected location.

According to various embodiments of the subject invention, probing of a DUT is done by applying stimulation signals to the DUT, and illuminating the DUT with a laser beam. The reflection of the laser beam is collected and analyzed to provide a spatial map of one or more of the reflection's amplitude, intensity and phase for each point in a selected area of the DUT.

Various embodiments of the present invention find faults in an integrated circuit by analyzing signals induced on a laser beam reflected from an active region of the device. The analysis can include detecting RF power at a certain bandwidth or bandwidths, demodulating the in-phase and quadrature components of an RF signal, power filtered by a matched filter, and displaying the result either at a fixed position or by creating a spatial map of the induced effect. The technique may also involve comparing signals from a known good die and from an inspected die.

Various embodiments of the present invention solve the problem of isolating faults in an integrated circuit without making physical contact with the circuit. In particular, it can isolate resistive faults between gates without requiring synchronous detection from a tester or stimulus board.

According to various embodiments of the present invention, an apparatus for providing modulation mapping is provided. The apparatus includes a laser source, a motion mechanism providing relative motion between the laser beam and the DUT, signal collection mechanism, which include a photodetector and appropriate electronics for collecting modulated laser light reflected from the DUT, and a display mechanism for displaying a spatial modulation map which consists of the collected modulated laser light over a selected time period and a selected area of the IC.

In one embodiment of the invention, an apparatus for providing modulation mapping is provided, wherein a spectrum analyzer is used for generating the modulation mapping.

In another embodiment of the invention, an apparatus for providing modulation mapping is provided, wherein a lock-in amplifier is used for generating the modulation mapping.

Various embodiments of the invention also provide for a laser scanning mechanism that is operable to scan the selected area to obtain an image of the scanned area, and is operable to scan the selected area to obtain modulation signal from the scanned area. The generated image is then used to normalize the modulation signal and the normalized modulation signal is used to generate a normalized modulation mapping.

In another embodiment of the invention, a system for testing an integrated circuit microchip using laser probing comprises a laser source providing a laser beam; a beam optics receiving said laser beam and focusing said laser beam onto a selected spot on said microchip; a photosensor receiving reflected laser light that is reflected from said microchip and providing an electrical signal; collection electronics receiving the electrical signal from said photosensor and providing an output signal; an analysis system receiving said output signal and providing a total power signal.

According to one aspect of the invention, a method is provided for testing an integrated circuit (IC), the method comprising: stimulating said IC with a test signal; illuminating said IC with a laser beam; collecting beam reflection from said IC; converting said beam reflection to an electrical probing signal; selecting one or more frequencies or a band of frequencies of said probing signal; calculating at least one of total amplitude, total intensity, and phase of said probing signal at the selected frequency or band of frequencies.

Other aspects and features of the invention will become apparent from the description of various embodiments described herein, and which come within the scope and spirit of the invention as claimed in the appended claims.

BRIEF DESCRIPTION OF THE DRAWINGS

The patent or application file contains at least one drawing executed in color. Copies of this patent or patent application publication with color drawings will be provided by the Office upon request and payment of the necessary fee.

FIG. 6a depicts a reflectivity map of a DUT, while

The invention is described herein with reference to particular embodiments thereof, which are exemplified in the drawings. It should be understood, however, that the various embodiments depicted in the drawings are only exemplary and may not limit the invention as defined in the appended claims.

DETAILED DESCRIPTION

Various embodiments of the present invention provide apparatus and method for testing an integrated circuit. As is known, integrated circuits include active devices, such as transistors. The subject invention is based on the inventor's observation that when a transistor is active, it can modulate a light beam illuminating active regions of the transistor. The strength of the modulation depends on the transistor's response to a potential applied to it. Consequently, when a laser beam illuminates the active area, the reflection would be modulated according to the active area's response to applied potential. On the other hand, when the beam illuminates an inactive area, the reflection would not be modulated. Therefore, the study of the beam reflection can provide information regarding the response of active areas to applied potential. It should be noted, however, that while the discussion herein refers to the use of laser beams, other light sources may be used, so long as it is of sufficient energy to enable detection with acceptable signal to noise ratio (SNR) and is sufficiently monochromatic to enable the interaction.

Heretofore, artisans have been studying the time-based waveform of the reflected laser light. While such studies provide useful information, the present inventor has determined that further insight can be gained by other studies of the reflected light. More specifically, the subject inventor has determined that information regarding the functionality of the DUT can be gained by studying the amplitude, intensity, polarization rotation, and/or phase of the reflected beam at each selected location on the DUT. The following description provide various embodiments for methods and apparatus enabling such studies.

An embodiment of the invention will now be described in details with reference to FIG. 2. In this embodiment of the invention, the DUT is provided with test signals, 242, e.g., from PC 270. As is shown by callout 248, the signal may be a simple square wave at a selected frequency $\phi$. Concurrently, laser source 202 provides a laser beam 204. In this particular example, a tunable or continuous wave (CW) laser source may be used, although other sources may be used, such as pulsed or mode-locked laser sources. Optionally, beam splitter 206 is provided to reflect a small portion of the beam, e.g. 5%, towards optional photodetector 208. The output of photodetector 208 is used to monitor the proper operation of the laser source 202. This feature is beneficial, but is not necessary for the operation of the invention. The laser beam is then conditioned and directed onto the DUT 260 by the beam optics 212. The beam optics may include beam manipulation optics, BMO 235 for focusing and conditioning the beam to the desired properties. Beam optics 212 may also include elements 230 for pointing and/or scanning the beam over the DUT. Such element may be, for example, an LSM. On the other hand, rather than using pointing or scanning mechanism, the beam may be stationary and provisions made for moving or scanning the DUT. This can be achieved by, for example, structuring the DUT holder 232 to function as a controllable X-Y stage. In essence, any structure enabling relative motion between the beam and the DUT is acceptable.

The reflected beam from the DUT is collected by the beam optics 212, and is directed towards the photodetector 236. The photodetector provides an output, normally an analog electrical signal, that is representative of the reflected light beam. The AC component (generally RF) of the photodetector output is amplified by amplifier 264 (e.g., an RF amplifier), and the amplified signal is provided to a spectrum analyzer 246. The user may select a specific frequency or a specific band of frequencies, and the spectrum analyzer output the total power, TP, received in the specified frequency or band of frequencies. More specifically, as is shown in callout 244, the amplified signal has a spread of power P over its frequencies f. The user may select a single frequency $f_0$, and the spectrum analyzer would provide the power $P_0$ of the signal in the selected frequency. Alternatively, the user may select a band of frequencies, $\Delta f$, in which case the spectrum analyzer would output a value for the total energy for the selected band. It should be appreciated that the frequency $f_0$ at which peak power is observed relates to the frequency $\phi$ of the input signal to the DUT. When the reflected power is given by $P_R$, the frequency is $w_0$, and the width of the frequency band is $\Delta w$, the total integrated power is given by:

$$\int_{w_0}^{w_0+\Delta w/2} P_R(w)\,dw. \qquad \text{Eqn. 1}$$

The total power output, TP, from the spectrum analyzer 246 is collected over a specified period of time, e.g., by frame grabber 276, and the resulting value is provided to the user, e.g., on display 274 of PC 270. The collection over a period of time can be beneficially obtained by integrating the output of the spectrum analyzer over a specified period of time. Notably, as can be understood, rather than presenting the waveform as is done in the prior art, in this embodiment a spectrum analyzer is used to determine the amount of power in a selected frequency or a band of frequencies of the reflected laser beam. By providing this value for each selected location on the DUT, the functionality of various devices of the DUT can be analyzed. As can be seen, to perform this analysis a simple test signal, such as a simple square wave is sufficient. Consequently, for this testing there is no need to employ an expensive ATE. Rather, one can use the PC 270 to generate the test signal.

Figure 2:
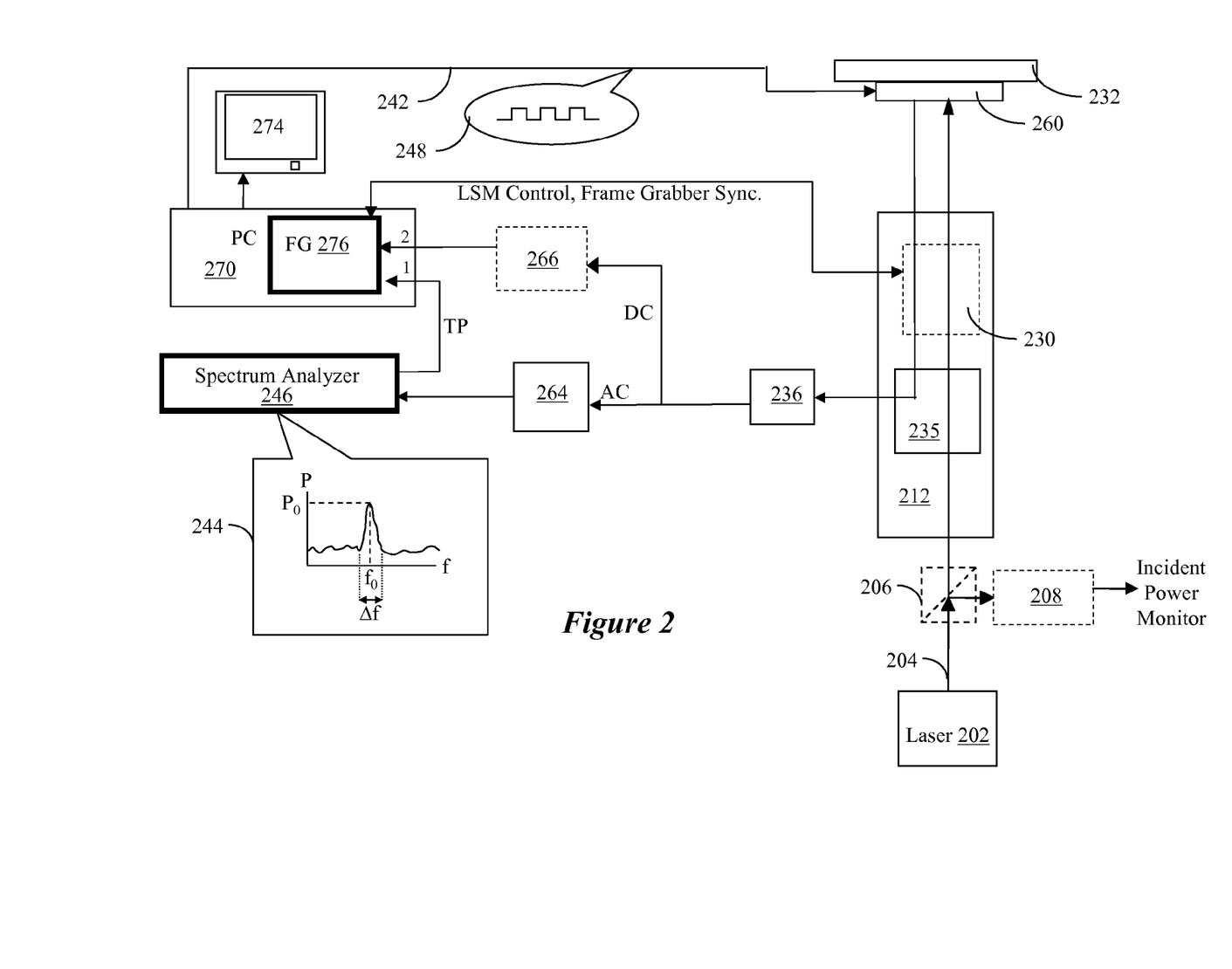
FIG. 2 is a diagram illustrating a first embodiment of the present invention.

As also shown in FIG. 2, the DC part of the photodetector signal can be input to a video amplifier. The signal of the video amplifier can be used to generate a video image to enable navigation over the DUT. Additionally, according to a feature of this embodiment, the signal from the video amplifier can be used to normalize the signal from the spectrum analyzer. This feature is particularly beneficial when a scanning of a selected area of the DUT is performed, so as to generate a modulation map. The modulation map is a spatial map upon which the total power at a selected frequency or band of frequencies is indicated for each location of the scanned area. The signal from the video amplifier can be used to generate a normalized modulation map, i.e., a spatial map upon which the total power at a selected frequency or band of frequencies is indicated for each location on the scanned area, as normalized by the video image signal.

Figure 3:
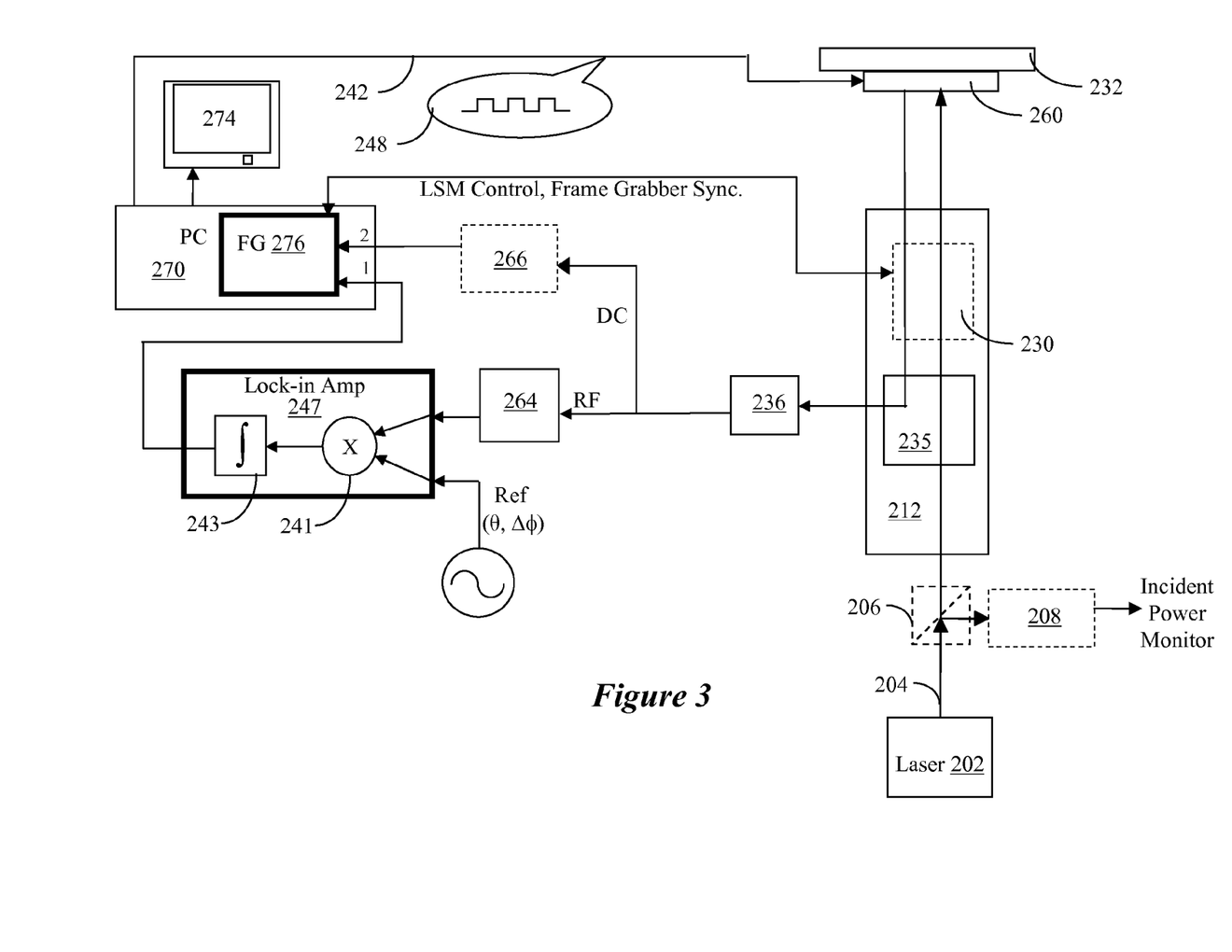
FIG. 3 is a diagram illustrating another embodiment of the present invention.

FIG. 3 depicts another embodiment of the present invention. Notably, the embodiment of FIG. 3 is similar to that of FIG. 2, except that the spectrum analyzer has been replaced with a lock-in amplifier. Therefore, the description of the embodiment of FIG. 3 is limited to the feature of the lock-in amplifier, and all elements similar to that of FIG. 2 have the same reference characters as in FIG. 2. As shown, the signal from the AC amplifier is fed to the lock-in amplifier. Additionally, a reference signal is also fed to the lock-in amplifier. Generally, if the reflected detection signal is given by $I_R(t)$, and the reference signal is given by L(t), both signals are multiplied by each other and then integrated, so that the output of the lock-in amplifier is given by:

$$\frac{1}{T}\int_0^T L(t)I_R(t)\,dt. \qquad \text{Eqn. 2}$$

The reference signal is of frequency $\theta$, which would typically be set to be the same as that of the AC signal output by the AC amplifier, but phase shifted by a selected amount $\Delta\phi$. As can be understood, the frequency $\theta$ relates to the frequency $\phi$ of the test signal. As shown in Eqn. 2 and in FIG. 3, in the lock-in amplifier the signals are first multiplied by each other, 241, and the resulting product is integrated, 243. The output is then collected by the frame grabber 276, so that a total power value is resulted for each defined period of time. Using this value, the activity of the DUT can be analyzed. As in the embodiment of FIG. 2, total power values for multiple locations of a selected area of the DUT can be obtained and then spatially plotted to provide a modulation map, i.e., a spatial map of the selected area with total power value indicated for each location. Also, as in the embodiment of FIG. 2, an image of the DUT can be obtained and used to normalize the power values, so that a normalized power map can be constructed.

Figure 4:
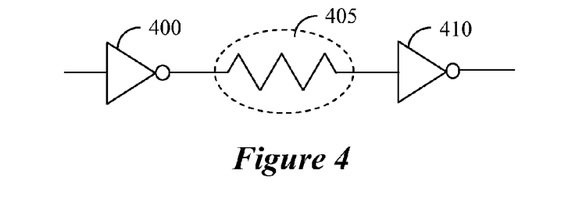
FIG. 4 is a diagram illustrating a fault between two active nodes of a DUT.

The embodiment of FIG. 3 can also be used to find faults in the DUT by looking at phase shift in the reflected light. More specifically, when a connection from a particular node to an active element is faulty, it can cause delay in the test signal reaching that active element. This is illustrated in FIG. 4, wherein a fault 405 is depicted as a resistive element between active elements 400 and 410. Under such circumstances, the active device 410 would respond once the signal is received, but the response would be delayed in time. Such faults cannot be easily detected using conventional techniques, such as OBIRCH or static emission, and would require exact synchronization with a tester, such as an ATE, to be detected using dynamic emission testers. However, using the embodiment of FIG. 3, no synchronization is needed and the test signal may be a simple sine or square wave signal.

When the test signal has a periodic format, such as a sine or square wave signal, the faulty connection would cause a delay in the signal reaching the device, and the device would respond in a delayed manner. Consequently, if a laser beam illuminates the device, the reflected beam would be modulated periodically at the same frequency as the test signal, but it would be phase shifted. This phase shift can be detected using the embodiment of FIG. 3, since a phase shift in the input signal to the lock-in amplifier would cause a change in the product signal resulting from the multiplication of the input and reference signal. Lock-in and frequency demodulation techniques are well known in the art.

Figure 5A:
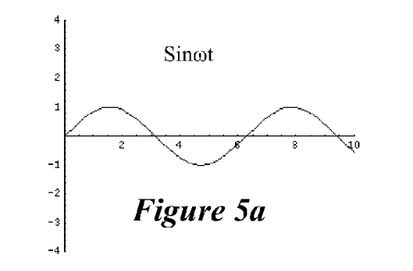
FIGS. 5a-5e are plots illustrating multiplication of probing and reference signals.
Figure 5B:
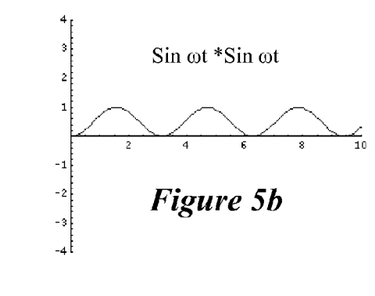
Figure 5C:
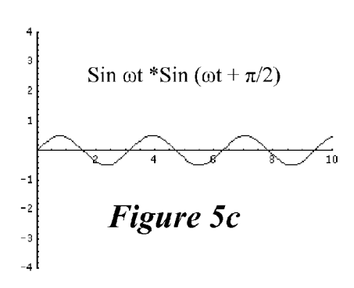
Figure 5D:
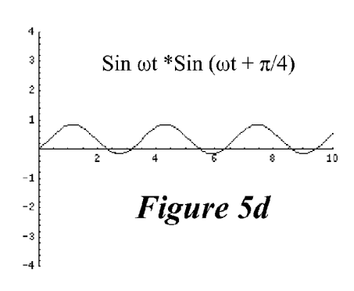

The operation of the embodiment of FIG. 3 can be understood from the following description with reference to the plots of FIGS. 5a-5e. Assuming that the test signal is a sine wave of frequency $\Theta$ ($\omega t$) as shown in FIG. 5a, then the reflected laser beam will be modulated at the same frequency so that the signal input to the lock-in amplifier also has frequency $\Theta$. If the reference signal is also a sine wave of frequency $\Theta$ and same phase as the input signal, then the multiplication of the input and reference signals results in the signal shown on plot 5b. If, however, the reference signal is shifted by $\pi/2$, then the resulting product is as shown in FIG. 5c, which will integrate to zero. Therefore, it is beneficial to set the reference signal at the same frequency, but shifted by $\pi/4$, so that the resulting product is as shown by FIG. 5d. Then, whenever the laser beam is placed over an active region, the resulting product will be as shown in FIG. 5d and the integration of that product over a specified period will result in a given value. This value can be displayed, compared to a known value calculated or experimentally obtained from a known properly functional region, or compared to values obtain from other active regions on the same or different DUT. If the value deviates by a more than an allowable amount, then the active region can be flagged as faulty.

Figure 5E:
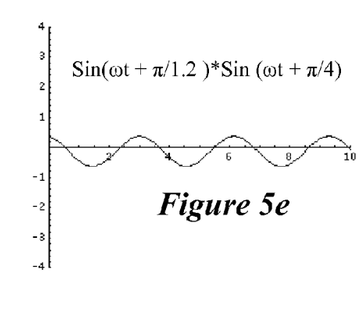

As explained previously, when a connection to an active region is faulty, it may cause delay in the reception of the test signal by the active region. Under such circumstances, the RF signal on the reflected laser beam would be phase shifted. As shown in the plot of FIG. 5e, the reference signal is kept at $\pi/4$ shift from the proper, un-shifted detector signal. However, if the signal from the reflected beam is also shifted, in this example by $\pi/1.2$, then the resulting plot shifts vertically, which would cause a change in the integrated value. This change can be used to detect faulty active regions on the DUT.

Figure 6A:
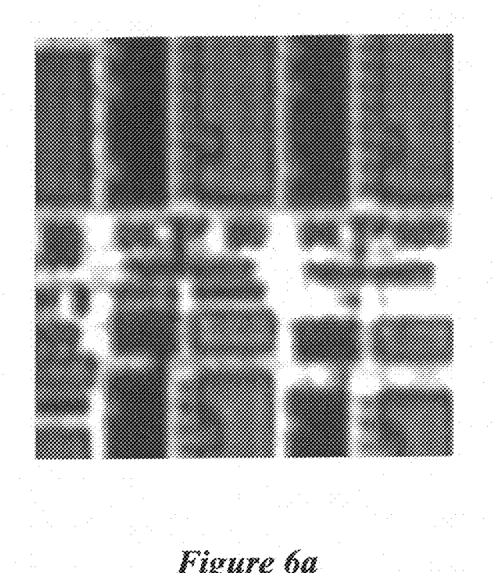
Figure 6B:
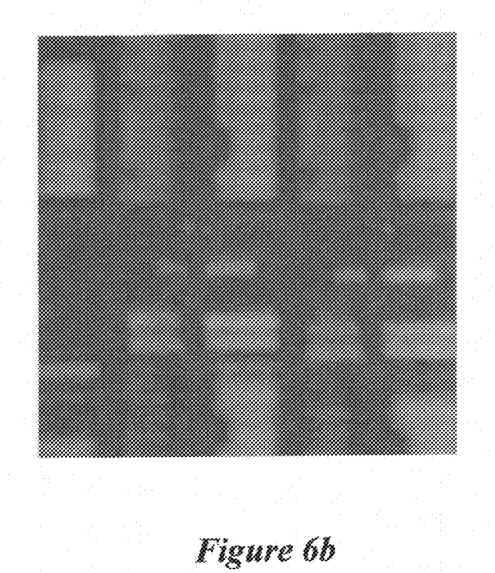
FIG. 6b depicts a modulation map generated according to an embodiment of the invention.

FIG. 6a depicts an image of transistors in an integrated circuit obtained using the inventive system to map reflected light intensity, i.e., the image is constructed using the output from the video amplifier. In this image, which is generally a reflectivity map, higher grayscale values indicate higher reflectivity regions. FIG. 6b, on the other hand, depicts modulation map, showing activity of various devices within the DUT at a particular frequency of interest. In this particular example, the modulation data was acquired simultaneously with the image of FIG. 6a and a spectrum analyzer was employed. In this modulation image higher grayscale values indicate larger modulation signal, i.e., active regions. In this example the DUT was driven with 100 MHz clock, and the spectrum analyzer was tuned to 100 MHz frequency.

Figure 7:
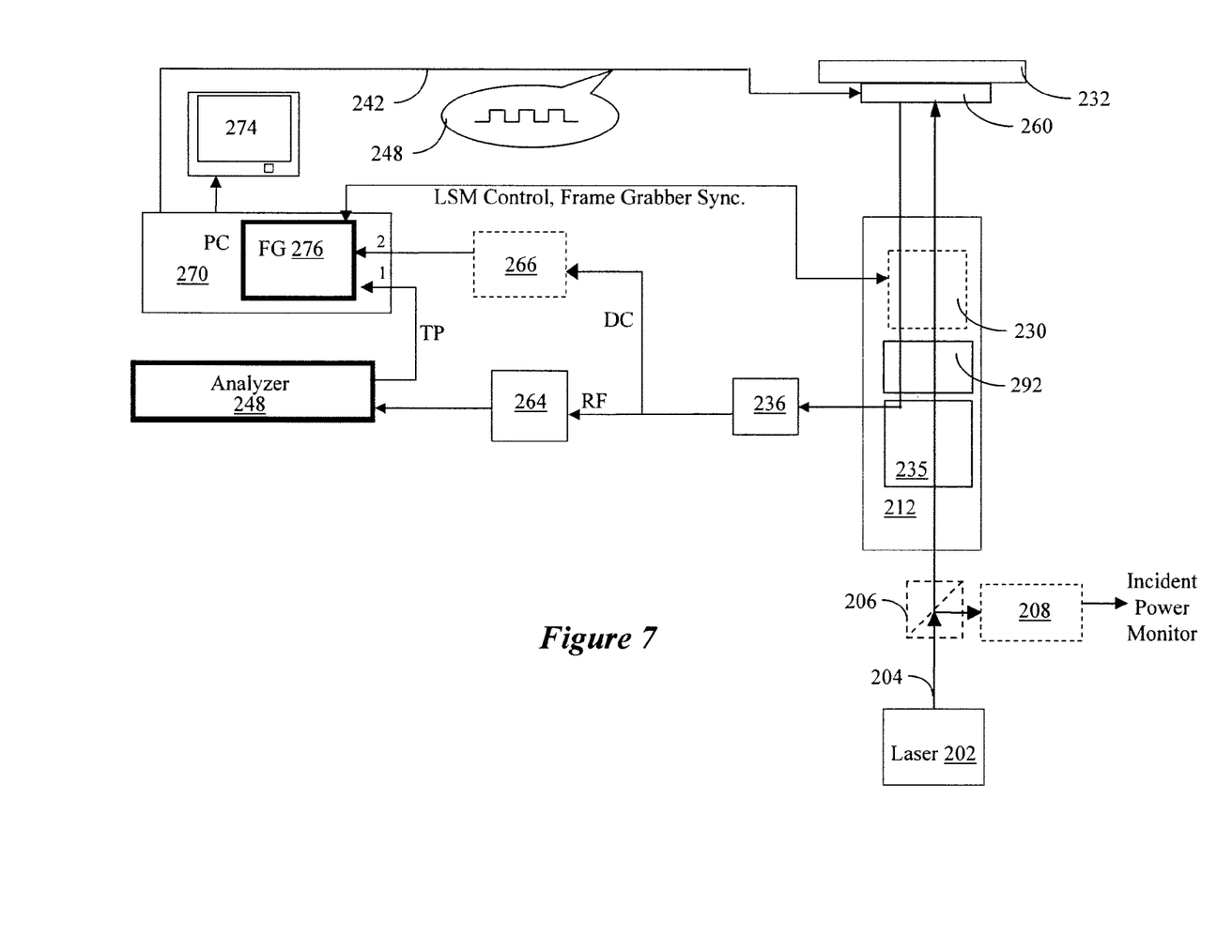
FIG. 7 depicts another embodiment of the present invention.

FIG. 7 depicts another embodiment of the subject invention. As can be understood from the above description, the embodiments of FIGS. 2 and 3 rely mainly on amplitude modulation of the laser beam. The embodiment of FIG. 7 is designed to detect phase modulation of the laser beam. Therefore, while the system of FIG. 7 is similar to that of FIGS. 2 and 3, the embodiment of FIG. 7 also employ a phase to amplitude converter 292. The output of the phase to amplitude converter 292 is applied to the photodetector 236 and is amplified by RF amplifier 264. The amplified signal is then provided to the analyzer 248, which may be a spectrum analyzer, a lock-in amplifier, etc., as explained with respect to FIGS. 2 and 3. The phase to amplitude converter 292 may be any conventional converter, such as a Michelson interferometer, spatial differential interferometer, time differential prober, etc. Such systems are described in U.S. patent application Ser. No. 11/169,423, commonly assigned to the present assignee, which is incorporated herein by reference in its entirety.

Figure 8:
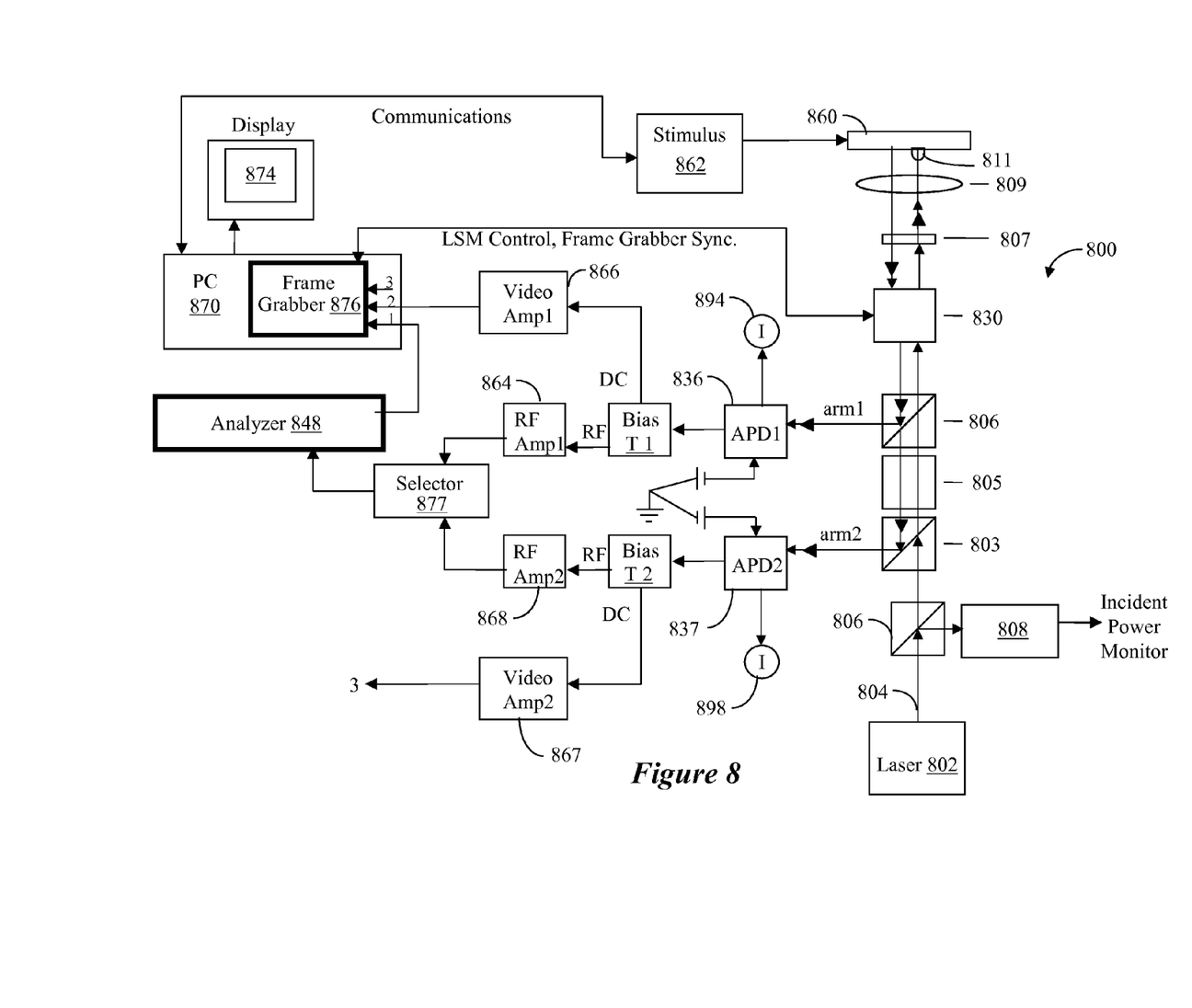
FIG. 8 depicts yet another embodiment of the present invention.

FIG. 8 illustrates another embodiment of the subject invention. The embodiment of FIG. 8 is similar to that of FIG. 7, except that a polarization differential probing (PDP) optics, 800, is used as a phase to amplitude converter. The PDP optics is described in more details below. The system operates as follows. The DUT 860 is stimulated with test signals from stimulus 862, which may be a stand alone equipment or part of computer 870. If the stimulus 862 is a stand alone device, it is beneficial to provide a communication link between the computer 870 and the stimulus 862, as shown. While the DUT is stimulated, laser source 802 provides laser beam 804. Optionally, a small portion of the laser beam is deflected by polarizing beam splitter 806 and is detected by photodetector 808 so as to monitor the operation of the laser source 802.

The remainder of the laser beam passes through polarizing beam splitter 803 and enters a Faraday rotator 805. The beam then passes through another polarizer beam splitter 806. Upon exiting beam splitter 806, the beam is actually composed of two orthogonal polarization states, or two co-located beams polarized at 90° to each other. Both beams then enters a scanning mechanism 830, which may be an LSM, AOD (acoustic-optical deflector), scanning lens, tube lens, etc. In this embodiment, an LSM 830 is used, which is controlled by computer 870. The beams then passes a variable retarder 807, which retards only one of the beams. This beam retardation is shown schematically in FIG. 8 by the double-headed arrow. Both beams then pass through the objective lens 809 and enter the DUT 860. The objective lens 809 may be a simple single lens, or a combination of lenses optionally including a solid immersion lens (SIL) 811.

One or both beams may be modulated by the DUT upon reflection; however, as will be explained further below, the inventors have observed that the beams are modulated by a different amount. The reflected beams pass through the objective lens 809 and enter the variable retarder 807, wherein an additional retardation is introduced. After passing the scanner 830, half of each beam is deflected by the polarizer beam splitter 806 towards photodetector 836, and the remaining half is passed through the Faraday rotator 805 and is deflected by the polarizer beam splitter 803 towards photodetector 837. In this embodiment, each photodetector is an avalanche photodiode (APD). The output from photodetector 836 is applied to bias T1, while the output of photodetector 837 is applied to bias T2. Optionally, the DC component of the signal is routed to video amplifier 866 and to frame grabber 876 to generate an image of the DUT. Another option is to have the DC component of the signal of bias T2 also routed to video amplifier 867 and to frame grabber 876 to generate another image of the DUT. The AC part of each signal is amplified by RF amplifiers 864, 868, and the signal is applied to selector 877. Selector 877 provides an output that may be a summation/difference of both signals, the signal of T1 only, or the signal of T2 only. The output of the selector 877 is then applied to the analyzer 848, which may be a spectrum analyzer, lock-in amplifier, etc., as explained with respect to FIGS. 2 and 3.

Figure 9:
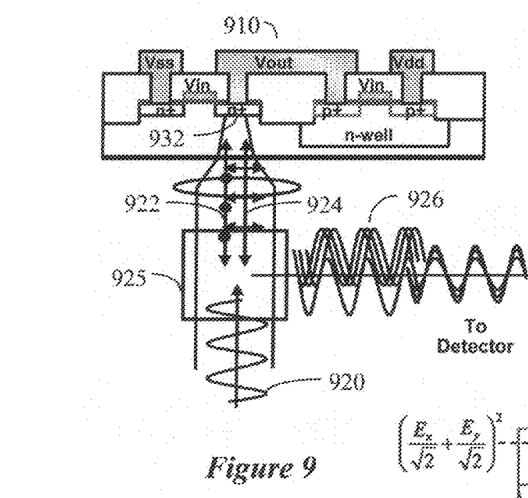
FIG. 9 is a diagram illustrating the polarization differential probing (PDP) mode for phase detection according to an embodiment of the invention.

FIG. 9 is a diagram illustrating the polarization differential probing (PDP) mode for phase detection, as can be employed in the embodiments of FIGS. 7 and 8. A laser beam 920 from a single modulated laser source is split into two orthogonally polarizes laser beams 922, 924, by beam optics 925. Both beams 922, 924 traverse the same optical path, but have orthogonal linear polarization states as depicted by the dots and arrows. Unlike conventional polarization schemes where two different locations on the DUT are illuminated by the reference and the probing beams, in this embodiment both beams are made to incident on the same point 932 on the DUT 910. Also, unlike the polarization scheme of the prior art where the two beams are split in time, in this embodiment both beams are made to be incident on the DUT 910 at nominally the same time. For optimal effect, the polarization directions of the beams 922, 924 are aligned with the transistor gate width and length directions in the DUT 910. This polarization difference results in phase modulation differences between the two beams after DUT interaction, as will be demonstrated below with reference to FIG. 10. The two beams 922, 924 are made to interfere 926 after their DUT interactions in order to convert their phase variations into amplitude variations that can be detected using photosensors. A differential detection scheme can be optionally employed to increase signal modulation.

Figure 10:
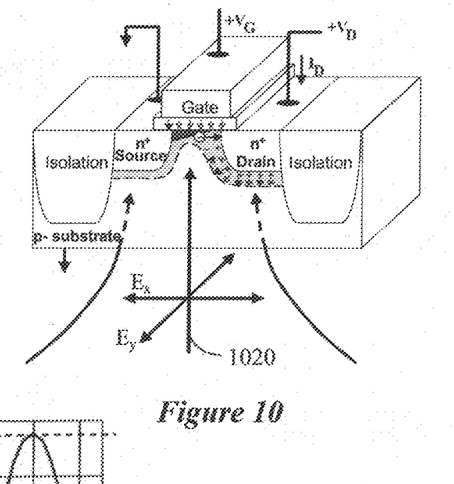
FIG. 10 is a diagram illustrating why the laser probing signal modulation is intrinsically polarization sensitive for CMOS transistors due to the asymmetric structure of the CMOS device.

FIG. 10 is a diagram illustrating why the laser probing signal modulation is intrinsically polarization sensitive for MOS transistors due to the intrinsic asymmetry of the MOS device. A laser beam 1020 is incident from the bottom (through the silicon substrate). For maximum Franz-Keldysh effect (electro-absorption/refraction), the laser beam's polarization state should be aligned parallel to the direction of the strong modulating fields in the gate/drain regions of the transistor, i.e., along the gate length direction (along $E_x$ in FIG. 10). On the other hand, the Plasma-Optical effect requires the laser beam to drive the charge carriers induced under the gate. Since the charge carriers are less constrained in the gate width direction, a laser beam polarized along $E_y$ should be most sensitive to this effect. In practice, the laser beam is found to be most strongly modulated when its polarization vector is aligned along $E_y$. Using these effects, the present inventors realized that, unlike the prior art interferometric arrangements, the reference beam need not traverse a reference path separate from the probing path. Rather, it is possible to have both reference and probing beams traverse the same path and be pointed onto the same point on the DUT at nominally the same time, while still obtaining an interferometric effect that correlates to the DUT's response to the stimulating signal. Of course, it should be appreciated by artisans that the use here of "reference beam" and "probing beam" is for convenience purposes only, since it should be apparent that unlike the prior art, here both beams illuminate the exact same area to be investigated at nominally the same time and, therefore, in this sense, each beam can be both a reference and a probing beam.

Figure 11:
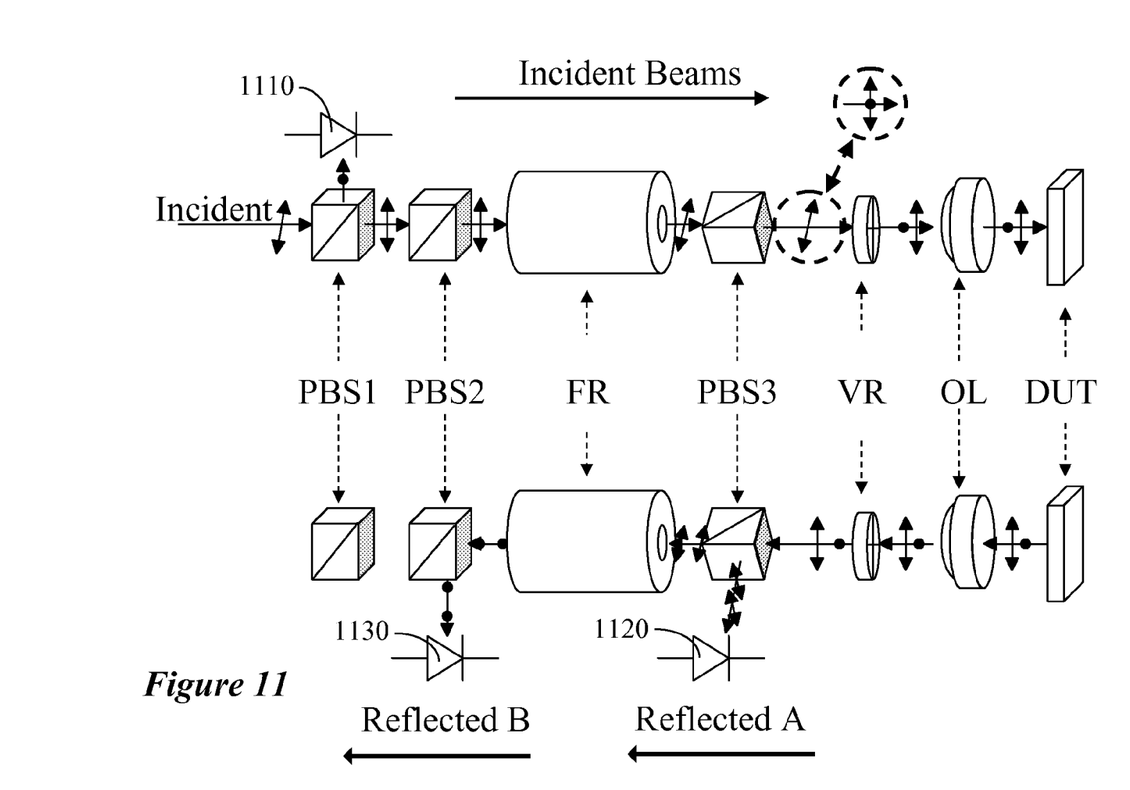
FIG. 11 is an illustration depicting a PDP optical path according to an embodiment of the invention.

FIG. 11 is an illustration depicting a common-path PDP optical arrangement according to an embodiment of the invention. While in actuality the incident beam and the reflected beam traverse the same elements, for better understanding the illustration is divided into two optical paths, showing each optical element twice. The top path is the incident beam path originating from the laser source, while the bottom path is the reflected beam path. The incident beam travels from left to right in the illustration. Along the beam path, vertically oriented arrows indicate a vertically polarized beam while dots indicate a horizontally polarized beam. A tilted arrow indicates a beam that is linearly polarized at some angle off the vertical. Spatial separation between a dot and an arrow depicts a phase difference between the two beams.

The beam from the modulated laser source enters the first polarizing beam splitter PBS1 so that part of the beam is deflected towards light sensor 1110. This deflection may be set at 5% or so. The output of the sensor 1110 is used to monitor the beam's intensity and is not part of the PDP optics, but is rather an optional intensity monitor. The remaining part of the beam that passes through the first PBS cube (PBS1) enters the second polarizing beam splitters PBS2, which is oriented to pass only a vertically oriented beam. The beam's polarization state is rotated a predetermined amount so as to generate a rotated polarized beam that is an equivalent of a superposition of a vertically polarized beam and a horizontally polarized beam. In this example, the beam is rotated 45 degrees from the vertical by the action of the Faraday rotator (FR) and the third PBS cube (PBS3) is oriented to transmit the rotated beam. Consequently, at this stage the beam is the equivalent of a superposition of a vertically polarized beam and a horizontally polarized beam, both beams equal in amplitude and in phase with each other. If the amplitude of the beam should not be set to equal, the rotation should be to a different angle. The dashed callout circles in the incident beam path, between PBS3 and VR, indicate the equivalence between a 45-degree polarized beam and two in-phase, equal amplitude beams, one polarized vertically and the other horizontally. As can be understood, for certain application the rotation may be to other than 45 degrees, in which case the equivalence would be of two, in-phase beams, one polarized vertically and the other horizontally, but having different amplitude.

The two beams then enter the variable retarder VR. The fast and slow axes of the variable-retarder (VR) are aligned along these vertical and horizontal polarization directions. Thus, after passage through the VR, the beam consists of two spatially coincident, equal-amplitude, orthogonally polarized beams that are phase-shifted (retarded) with respect to each other by a small amount (nominally, $\pi/4$). This is indicated in the illustration by the dot being slightly behind the vertical arrow, representing a retardation of the horizontally polarized beam relative to the vertically polarized beam. The two beams are then focused onto the same point on the DUT by the objective lens OL. The DUT is oriented such that the polarization directions of these two beams are aligned with the length and width directions of the transistor gates. Interaction with the DUT phase modulates one of the beams relative to the other by a small amount. In this manner, the beam being modulated by the DUT may be thought of as the probing beam, while the other beam may be thought of as the reference beam. Of course, unlike prior art interferometers, here none of the beams traverses a reference optical path, but rather both beams traverse the identical path to the probing location. Therefore, as noted before, in this sense there is no reference beam and probing beam, but for convenience one may refer to one beam as the reference beam and the other as the probing beam.

After the beams are reflected by the DUT (FIG. 11, bottom) the two linearly polarized beams retrace their path to the VR. The phase modulation induced on the beams by the DUT is typically much smaller than the phase shift induced by passage through VR and so is not explicitly shown here. Passing through the VR introduces an addition phase-shift between the two returned reference and probing beams (now nominally phase-shifted by $\pi/2$). At PBS3, a portion of each beam is reflected and sent to photosensor 1120, and the other portion is transmitted. The reflected portions interfere, since they are now in the same polarization state, and generate the reflected-A signal. In one embodiment, only one photosensor 1120 is used and its output is collected by the receiver electronics and analyzed, as described in more detail below. According to another embodiment, the transmitted portions are deflected out of the beam path via the action of FR and PBS2 so as to be detected by a second photosensor 1130. The transmitted halves also interfere since they are also in the same polarization state, generating the reflected-B signal. The reflected-B signal is collected by the receiver electronics and is analyzed, as described in more details below.

An analysis of the interference condition shows that the intensity of the reflected-A signal is given by:

$$R(A) \propto (E_x/\sqrt{2})^2 + (E_y/\sqrt{2})^2 - 2[(E_x/\sqrt{2})(E_y/\sqrt{2})]\cos(\theta+\delta) \quad \text{Eqn. 3.}$$

Here the $\theta$ term accounts for the static phase shift introduced by the double-pass through the variable rotator, VR, while the $\delta$ term is the small varying relative phase shift of the two beams resulting from the interaction with the DUT as it undergoes testing. Similar analysis for the reflected-B signal results in:

$$R(B) \propto (E_x/\sqrt{2})^2 + (E_y/\sqrt{2})^2 + 2[(E_x/\sqrt{2})(E_y/\sqrt{2})]\cos(\theta+\delta) \quad \text{Eqn. 4.}$$

Figure 12:
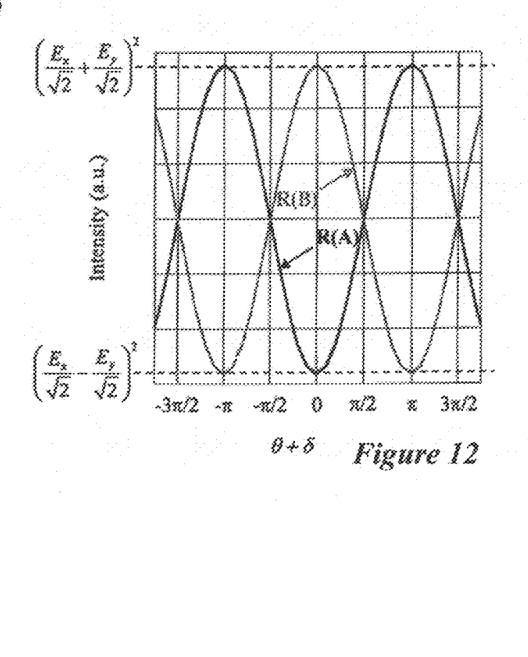
FIG. 12 is a plot illustrating the benefit of detecting both return beams of the PDP interferometer.

Eqn. 3 and Eqn. 4 are plotted in FIG. 12. From this plot, it is clear that setting the static phase shift, $\theta$, to $\pm\pi/2$ (quarter waver condition for the round trip beam) gives maximum sensitivity to changes in $\delta$ and makes the two signals nominally equal in intensity. Under this condition, Eqn. 3 and Eqn. 4 simplify, respectively, to:

$$R(A) \propto (\tfrac{1}{2})E_x^2 + (\tfrac{1}{2})E_y^2 + E_x E_y \sin(\delta) \quad \text{Eqn. 5.}$$

and $$R(B) \propto (\tfrac{1}{2})E_x^2 + (\tfrac{1}{2})E_y^2 - E_x E_y \sin(\delta) \quad \text{Eqn. 6.}$$

Then, $$R(A) - R(B) \propto 2 E_x E_y \sin(\delta) \quad \text{Eqn. 7.}$$

Thus, in principle, subtracting the two reflected signals eliminates their large DC component along with any noise it carries, such as from laser power variations, while doubling the signal modulation. Consequently an improved signal to noise ratio (SNR) is provided when using this differential signal detection mode. In practice, digitally dividing one signal by the other instead of subtracting them is performed because it is more tolerant of unbalanced reflected signals.

As can be understood, since both reference and probing beams traverse the identical optical path and are pointed to the same location on the DUT at nominally the same time, it means that this scheme has better phase noise immunity then prior art interferometric systems. Notably, both beams are subject to the same vibrations and optical losses. This eliminates or reduces the need for active vibration compensation, path length matching, and power matching of the two arms of the interferometer. Additionally, there is no need to find a second location for the reference beam for each location tested. Rather, both beams are always pointed at the location to be tested. Accordingly, there is also no need to introduce separate spatial control of the reference and probing beams. There is also no need for complicated beam time-shifting and unshifting optics and no coupling of signal strength with time resolution. Consequently, the inventive common-path PDP arrangement can be used in multiple applications where phase detection is needed and provides drastic reductions in vibration noise, reduces the system complexity, and simplifies the setup of the system.

Referring back to FIG. 8, in the embodiment depicted two photosensors, APD1 and APD2 are used. For an increase in light intensity of the probing signal, the two photodiodes may be used in a differential detection mode. According to the embodiment of a differential detection mode, one diode produces a positive going signal at its amplifier input, while the other one produces a negative signal. This can be done by negatively biasing one photodetector, say APD1, while positively biasing the other photodetector, as is shown schematically in FIG. 8. In this embodiment, the bias is to about −60V and +60V, respectively. Summing the two output signals, e.g., by selector 877, produces an enhanced differential signal. Monitoring the current of both APD's assists in checking the balance of the PDP optics, as the variable phase plate of the PDP can be adjusted until the same current is observed by the two current monitors 898 and 894.

During navigation or for generating a reflectivity map, the signal from only one APD is required. As is shown, the signal from each photosensor is also sent to a video amplifier, which provides a video out signal for processing and display. However, it is possible to use a signal from only one photodetector and one video amplifier to generate a reflectivity image. Advantageously, in order to provide contrast control, the variable retarder may be varied to tune the retardation so that the image contrast is varied to the desired result. Additionally, imaging may be performed using both APD's and the resulting images subtracted from each other so as to obtain a difference image.

In the various embodiments disclosed where two APD's are used, the APD's gain may be advantageously controlled to, first, balance the APD's response and, second, to improve the imaging. Using a controllable variable power supply that is manually or automatically controlled, the voltage/gain response of each APD can be determined. Then, using the learned voltage/gain response, the gain of each APD can be controlled to a desired value by selecting the appropriate voltage on the corresponding power supply. For balancing the system, the following procedure may be used. First, the voltage of the power supplies of each APD is set to result in the same gain provided by both APD's, thereby balancing the output of the APD's. Alternatively, if a different gain circuitry is used, it should be balanced to obtained balanced output. Then, the variable wave plate is adjusted until the current output of both ADP's is the same, thereby balancing the optical path. The variable gain can also be used for improved imaging. For example, when the image scan goes from a relatively dark area to a relatively bright area, the gain of the APD's may be reduced so as not to saturate the image. Conversely, when moving from a bright area to a dark area, the gain may be increased to provide improved contrast and detail.

Figure 13:
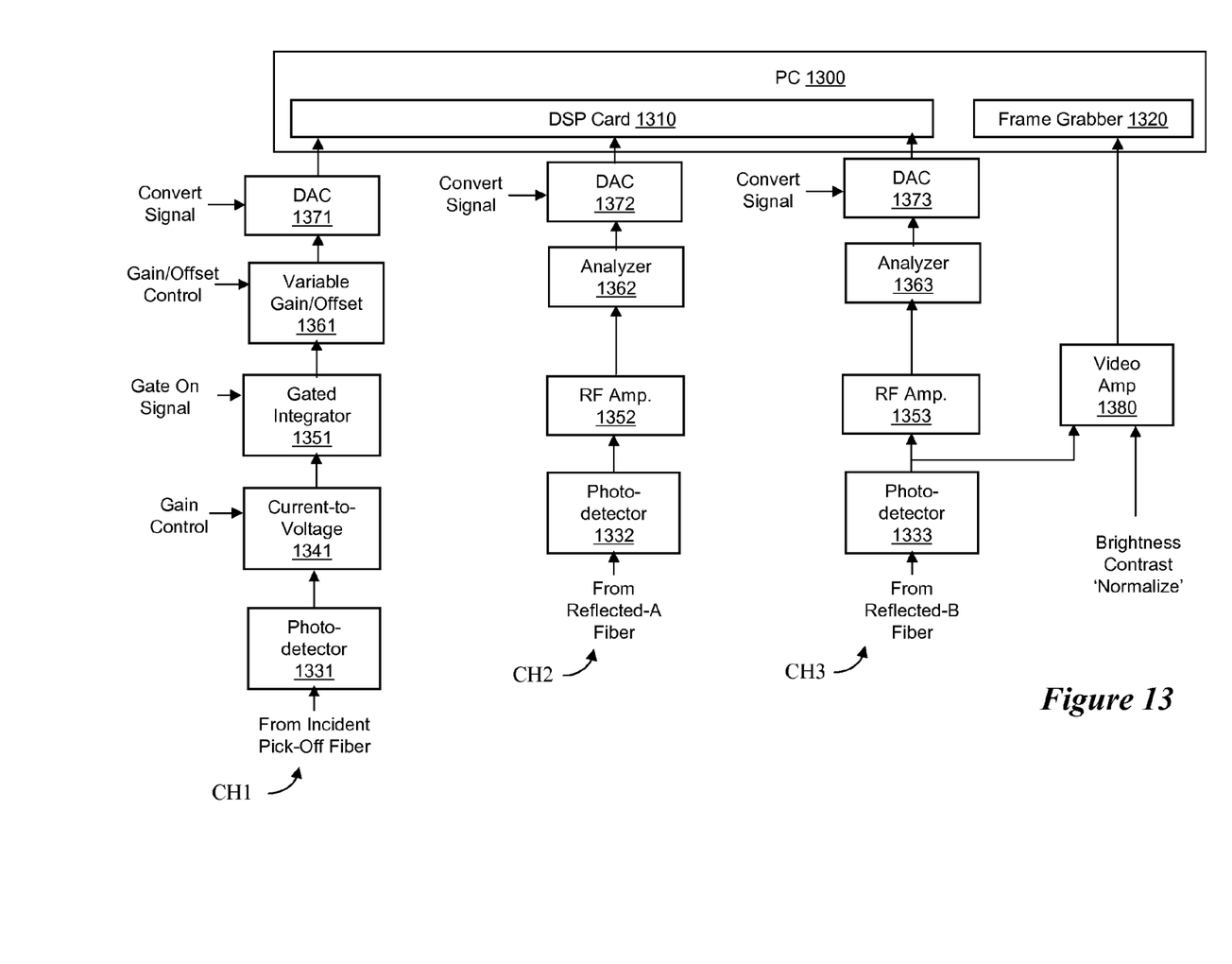
FIG. 13 illustrates a further embodiment of the invention.

FIG. 13 depicts a block diagram of another embodiment of the invention, wherein the signals are digitized individually. This allows the signals to be summed, subtracted, divided, etc. It also gives greater flexibility. For example, the ratio of reflected A/reflected B gives pure PDP signal, but this arrangement also enables other ratios, such as reflected A/Incident pick-off and/or reflected B/Incident pick-off simultaneously. The user may try various signals and then chose which provides the best result for a particular investigation.

In the embodiment of FIG. 13, a computer, such as a programmed personal computer PC 1300 is equipped with a digital signal processing card DSP 1310 and a frame grabber 1320. In this embodiment, three channels, CH1, CH2, and CH3, provide signals to the DSP 1310. Channel CH1 is optional and is used to monitor the operation of the laser source. Channel 1 comprises photosensor 1331 which receives a light signal from a fiber optics and outputs an electrical signal. The electrical output of the photosensor 1331 is applied to current to voltage converter 1341 which has variable transimpedance gain control. The output of the current to voltage converter is then applied to a gated integrator 1351, which is responsive to a gate-on signal. The signal from the gated integrator 1351 is applied to a variable gain/offset circuit 1361 to enable gain/offset control. The signal from the gain/offset circuitry 1361 is then applied to a digital/analog converter DAC 1371 to convert the analog signal into a digital signal. Variable gain/offset circuit 1361 allows the signal applied to DAC 1371 to be within the input range of the DAC. In this embodiment, a 14 bit DAC converter with internal sample/hold feature is used. The digital output is then provided to the DSP card for processing.

As is shown in FIG. 13, channel CH1 is used to monitor the output of the laser source and it receives the signal from the pick-off fiber as explained above. Channels CH2 and CH3, on the other hand, are used for the probing and receive the reflected signals Reflected-A and Reflected-B, respectively. Additionally, one of the channels, in this illustration channel CH3, is also used for imaging by applying the output of its current to voltage converter to a video amplifier 1380, the output of which is applied to the frame grabber 1320. The quality of the image may be adjusted by a brightness/contrast (or black level/gain) signal applied to the video amplifier.

The construction of channels CH2 and CH3 can be identical. Each channel receives signal from a fiber optics and a photodetector, 1332, 1333, converts the optical signal to an analog signal. The analog signal is amplified by the RF amplifier, 1352, 1353, and is input to an analyzer, 1362, 1363. The analyzer may be a spectrum analyzer as explained with respect to FIG. 2 or a lock-in amplifier, as explained with respect to FIG. 3. The output from the analyzer is digitized and supplied to the DSP card 1310. Notably, in this embodiment the signal from the analyzer is input to the DSP card, as it may provide a higher resolution than the frame grabber. It also allows for the beam to be set in a fixed x-y position while data is being acquired for a single spot on the DUT as the DUT is being stimulated with variable stimulus signal. This can be done repeatedly for various locations on the DUT. Also, when modulation data is acquired for various different stimulus signals, a series of modulation maps can be generated, one for each modulation signal. The series of maps can also be plotted into a 3-D plot with the DUT stimulus parameter plotted in, say, the Z-direction. Further investigations can be performed by generating cross sections of the 3-D plots. Additionally, the output of each analyzer can be input to more than one channel. This enables, for example, to provide simultaneous maps of amplitude and phase over the selected area of the DUT. Alternatively, one channel, say CH2 can be used to generate a power map, while the other to generate a phase map.

While the invention has been described with reference to particular embodiments thereof, it is not limited to those embodiments. Specifically, various variations and modifications may be implemented by those of ordinary skill in the art without departing from the invention's spirit and scope, as defined by the appended claims. For example, it should be understood that all of the embodiment described herein can be used for testing by comparing the resulting probing signal to a signal of a known device, or to a signal obtained from other devices on the same or different DUT. Additionally, all of the above-cited prior art references are incorporated herein by reference.

What is claimed is:

1. A method for probing an integrated circuit (IC), comprising:
    stimulating said IC with a test signal;
    illuminating a selected area of said IC with a laser beam;
    collecting beam reflection from said IC;
    converting said beam reflection to an electrical probing signal;
    selecting a frequency or a band of frequencies of said probing signal;
    calculating at least one of a total amplitude, a total intensity, and a phase of said probing signal at the selected frequency or band of frequencies;
    generating a spatial map of one of said total amplitude, total intensity, and phase, for various locations over a selected area of said IC; and
    displaying the spatial map on a monitor.

2. The method of claim 1, further comprising providing a reference signal and wherein said calculating comprises multiplying said probing signal with the reference signal to thereby provide a product signal, and integrating said product signal.

3. The method of claim 2, wherein said reference signal is of frequency similar to that of said probing signal.

4. The method of claim 1, wherein said calculating comprises calculating total power at the selected frequency or band of frequencies, and said generating a spatial map comprises generating a spatial map of total power for various locations over the selected area of said IC.

5. The method of claim 1, wherein said illuminating comprises scanning the laser beam over a selected area of said IC.

6. The method of claim 1, wherein said collecting beam reflection further comprises converting beam reflection phase into beam reflection amplitude.

7. The method of claim 1, further comprising generating an optical image of said selected area of the IC.

8. The method of claim 5, wherein said collecting comprises collecting beam reflection from said scanning and further comprising generating an optical image of said selected area from said beam reflection.

9. The method of claim 1, wherein said calculating comprises calculating a total amplitude of said probing signal at the selected frequency or band of frequencies.

10. The method of claim 1, wherein said calculating comprises calculating a total intensity of said probing signal at the selected frequency or band of frequencies.

11. The method of claim 1, wherein said calculating comprises calculating a phase of said probing signal at the selected frequency or band of frequencies.

12. The method of claim 1, wherein selecting comprises using a spectrum analyzer to detect signal frequencies corresponding to the selected area.

13. A method for probing an integrated circuit (IC), comprising:
   stimulating said IC with a test signal;
   illuminating a selected area of said IC with a laser beam;
   collecting beam reflection from said IC;
   converting said beam reflection to an electrical probing signal;
   selecting a frequency or a band of frequencies of said probing signal;
   calculating at least one of a total amplitude, a total intensity, and a phase of said probing signal at the selected frequency or band of frequencies and comparing the results to a reference signal of a good IC.

14. A method for probing an integrated circuit (IC), comprising:
   illuminating the IC with a light beam;
   stimulating said IC with a test signal;
   collecting beam reflection from said IC, wherein the beam reflection is modulated by the IC response to the test signal;
   converting said beam reflection to an electrical probing signal;
   detecting modulated beam reflection of said probing signal over a selected time period to obtain total modulation;
   displaying said total modulation for a fixed position or various locations over a selected area of said IC.

15. The method of claim 14, wherein detecting modulated beam reflection comprises detecting changes in at least one of amplitude, intensity, power, polarization rotation, and phase of the beam reflection.

16. The method of claim 14, wherein obtaining total modulation comprises integrating changes in at least one of amplitude, intensity, power, polarization rotation, and phase of the beam reflection.

17. The method of claim 14, wherein collecting comprises passing the beam reflection through phase to amplitude converter.

18. The method of claim 14, further comprising providing a reference signal and multiplying said probing signal with the reference signal to thereby provide a product signal, and integrating said product signal.

19. The method of claim 14, wherein said total modulation comprises calculating total power at the selected frequency or band of frequencies, and said displaying comprises generating a spatial map of total power over selected area of said IC.

20. The method of claim 14, further comprising displaying an optical image of corresponding area of the IC.

* * * * *